United States Patent
Poag et al.

(10) Patent No.: US 6,197,123 B1
(45) Date of Patent: Mar. 6, 2001

(54) METHOD FOR CLEANING A PROCESS CHAMBER USED FOR MANUFACTURING SUBSTRATES DURING NONPRODUCTION INTERVALS

(75) Inventors: Frank D. Poag, Plano; Richard L. Guldi, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/212,027

(22) Filed: Dec. 15, 1998

Related U.S. Application Data
(60) Provisional application No. 60/068,159, filed on Dec. 18, 1997.

(51) Int. Cl.[7] .............................. B08B 5/04; B08B 9/093
(52) U.S. Cl. .................. 134/18; 134/21; 134/22.1; 134/22.18; 134/24; 134/37; 134/902
(58) Field of Search .............................. 134/18, 21, 22.1, 134/22.18, 24, 37, 902

(56) References Cited

U.S. PATENT DOCUMENTS
5,607,515 * 3/1997 Takahashi ............................ 134/18

* cited by examiner

*Primary Examiner*—Zeinab El-Arini
(74) *Attorney, Agent, or Firm*—Wade James Brady, III; Frederick J. Telecky, Jr.

(57) ABSTRACT

A method for processing substrates such as semiconductor wafers (21) includes providing a chamber (12) having a production nozzle (26) and two cleaning nozzles (36, 41). During production intervals, a level of particles carried by gases exiting the chamber are measured by an in-situ particle monitor (53). If an abnormally high particle level is detected, a cleaning procedure is carried out during a nonproduction interval which exists between production intervals in a production mode. During this cleaning, the chamber is maintained at a low pressure by a vacuum pump (56), and a cleaning gas (GAS1) is supplied through valves (83, 103, 108) and mass flow controllers (81, 101, 106) to respective nozzles. The valves are controlled so as to pulse or modulate the flow of the cleaning gas to the nozzles.

7 Claims, 3 Drawing Sheets

METHOD FOR CLEANING A PROCESS CHAMBER USED FOR MANUFACTURING SUBSTRATES DURING NONPRODUCTION INTERVALS

This application claims priority under 35 USC §119(e)(1) of provisional application Ser. No. 60/068,159 filed Dec. 18, 1997.

TECHNICAL FIELD OF THE INVENTION

This invention relates in general to cleaning of a process chamber used for manufacturing substrates and, more particularly, to cleaning of such a chamber by providing a flow of a cleaning gas to the chamber.

BACKGROUND OF THE INVENTION

The manufacture of certain types of substrates is a time-consuming process which requires high levels of cleanliness. One example is substrates for integrated circuits. Many steps of manufacturing are conducted in various classes of so-called clean rooms, which have purified air flows to reduce the incidence of airborne particle contaminates. Nevertheless, wafers upon which semiconductor devices are fabricated can be rendered defective by contaminates introduced at various process steps.

In this regard, the manufacture of semiconductor devices typically involves process steps which are carried out on silicon wafers in process chambers, one example of which is an etching step. The level of particles in process chambers must be controlled, or else particles can be deposited on the wafers, thereby causing defects and significantly reducing the effective yield. In order to control the particle levels, process chambers are periodically subjected to a wet clean procedure, in which the chamber is disassembled or opened to the atmosphere, and then manually cleaned with a liquid such as water or isopropyl alcohol, in order to remove films from the chamber walls which contribute to the particle count. After such a wet clean, there will be an initial high level of particles for a brief period, as a result of the fact that the chamber has been opened to the atmosphere. However, in the process of resuming production, the level of particles will drop to a very low level as a result of the fact that the films removed from the chamber during the wet clean are no longer present to contribute particles.

After a wet clean, as production is carried out over time, the level of particles will begin to progressively increase, for example as films build back up on the chamber walls. In order to extend the time before the next wet clean must be carried out, it is possible to carry out one or more interim cleanings which do not require the use of liquids such as water or isopropyl alcohol.

One such interim approach, sometimes known as a cycle purge or pump purge, involves pumping the chamber pressure down, then raising the pressure by filling the chamber with a gas such as nitrogen or argon, and then pumping the chamber pressure back down. This cycle may be repeated several times. This approach is also used to reduce the particle levels following a wet clean and prior to resuming production. In any event, however, the time required to pump the chamber pressure down several times will usually necessitate an undesirable delay in production. This also means that the process chamber has a reduced availability to make products which can be sold.

Further, this technique essentially involves carrying out the purge cycle a predetermined number of times without taking any measurement of particle levels. If the entire procedure does not adequately reduce the particle levels, it is not immediately known that particle levels are unacceptable high. Alternatively, if particle levels are satisfactorily reduced substantially by the time the procedure is half complete, the procedure continues to completion anyway, which unnecessarily delays resumption of production. After completion of such a procedure, the particle levels may be measured by putting in the chamber some particle wafers that have been subjected to a pretest, then subjecting the particle wafers to a specified process, and then running a post-test analysis to see how many added particles are present. This is also a time-consuming technique, which delays the resumption of production. This same particle wafer test technique is also used to determine when to carry out the cycle purge procedure between wet cleans and, since it is a cumbersome technique, it is carried out relatively infrequently, which means that some production wafers will be processed in a chamber which is not suitably clean.

Another interim cleaning approach, commonly called a dry clean procedure, is to fill the chamber with inert gas such nitrogen or argon, and then strike a plasma to clean the chamber. Sometimes other gases such as oxygen are included, in order to assist in polymer removal. Depending on the particular process, such a dry clean procedure may be performed after processing of each wafer, only after processing each lot of wafers, or only on an "as-needed" basis. In any case, when the dry clean procedure is performed, the chamber is normally filled and the plasma struck only once, and the procedure does not involve any type of feedback regarding particle levels. After completion, particle levels in the chamber may be measured using particle wafers, with the associated disadvantages.

Yet another interim cleaning approach circulates a hot gas within the chamber, with forward and reverse gas flow. An in-situ particle monitor is provided to monitor particle levels. This process was developed primarily for use in eliminating moisture after a wet clean, rather than for reducing particle levels, although it does inherently have some effect in reducing particle levels. While a production mode of a process chamber typically involves successive production intervals for wafer processing which are spaced in time by nonproduction intervals, this hot gas circulation approach is not carried out during nonproduction intervals of the production mode.

SUMMARY OF THE INVENTION

From the foregoing, it may be appreciated that a need has arisen for a method and apparatus for effecting cleaning of a process chamber used for processing substrates, so as to permit efficient interim cleaning while the chamber remains in a production mode between production intervals, and so as to ensure that the chamber is known to be clean for every wafer processed. According to the present invention, a method and apparatus are provided to address this need, and involve providing a nozzle in the chamber, and causing a gas supply mechanism to effect cleaning of the chamber by supplying gas through the nozzle to the chamber during one of the nonproduction intervals, while pulsing a flow of the gas.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
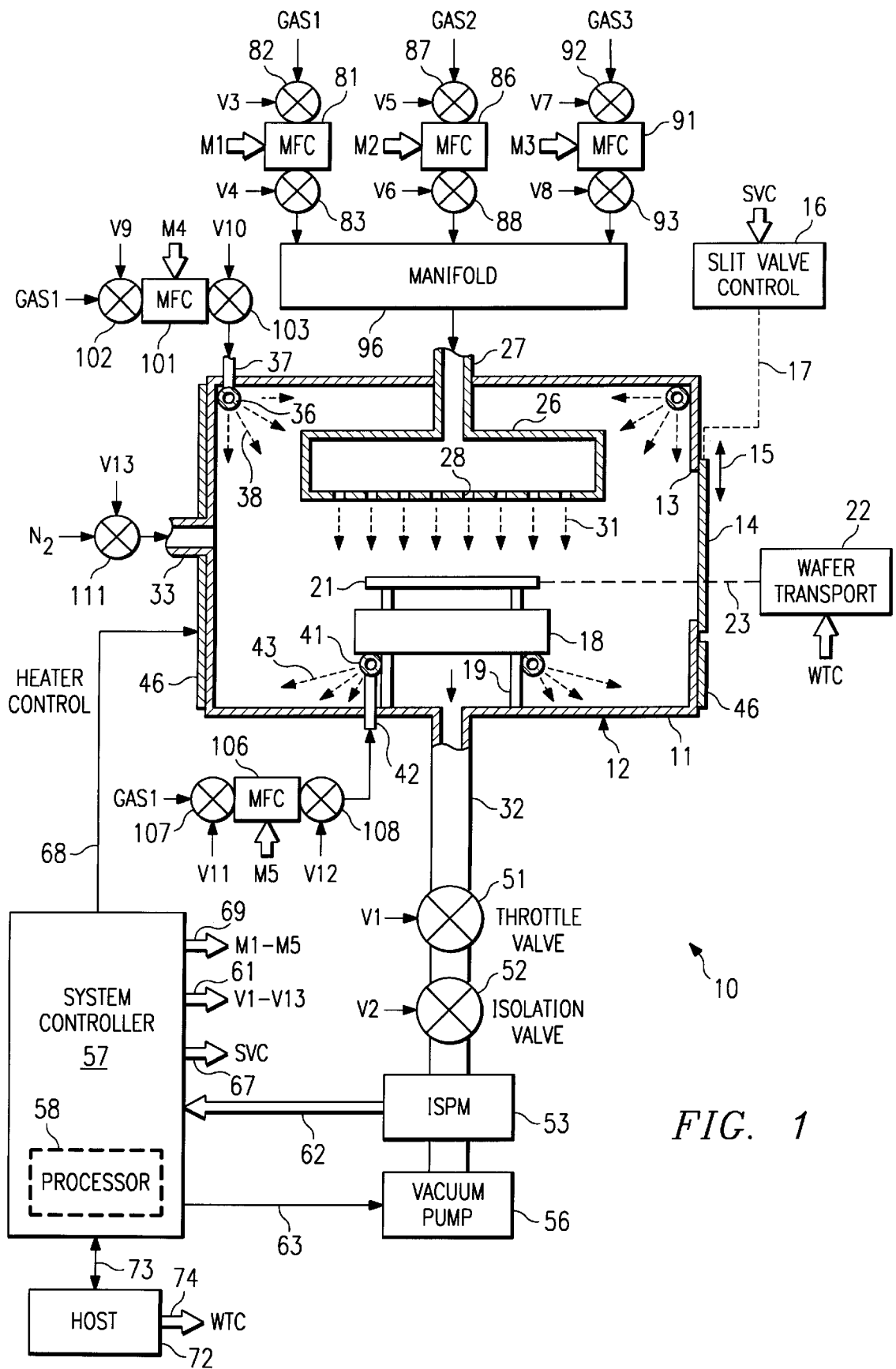
FIG. 1 is a diagrammatic view of a system which is used in the manufacture of semiconductor devices, and which embodies the present invention.

FIG. 1 is a diagrammatic view of a system 10, which is part of a semiconductor manufacturing apparatus. The system 10 includes a process chamber 12, which is used for certain steps in the processing of silicon wafers during the fabrication of semiconductor devices on the wafers. As one example, the chamber 12 may be used to carry out an etching step. Normal use of the process chamber can lead to an increased level of particles within the chamber, and when these particles are deposited on wafers the result is defects and reduced production yield.

Due to the buildup of particle levels, the chamber 12 must be periodically taken out of a production mode, opened or disassembled, and subjected to a wet clean procedure, where it is cleaned with a liquid such as water or isopropyl alcohol. Particle counts are normally highest immediately after such a wet clean, because the chamber has been opened to the surrounding environment. However, the particle levels will drop to a very low level as the chamber is readied for continued production. Then, as the chamber is operated in a production mode following such a wet clean, particles will eventually increase to unacceptably high levels, so that in time it becomes necessary to repeat the wet clean procedure. Although wet clean procedures must be periodically carried out, it is possible to extend the time between wet clean procedures by carrying out an interim cleaning procedure, which avoids the use of a liquid, and which typically involves supplying a gas to the process chamber.

Turning now in more detail to the process chamber 12 shown in FIG. 1, the chamber 12 includes a housing 11 having a cylindrical sidewall, and having flat top and bottom walls. A slit or opening 13 is provided through the sidewall of the housing 11 on one side thereof, in order to provide access to the chamber, for example for the introduction and removal of silicon wafers. A slit valve door 14 is supported for movement in directions indicated diagrammatically by arrow 15. In particular, the slit valve door 14 is supported for movement between open and closed positions in which the slit 13 is respectively covered and exposed. In FIG. 1, the slit valve door 14 is shown in its closed position. Movement of the slit valve door 14 is effected by a slit valve control mechanism which is shown diagrammatically at 16, the operative coupling between the control mechanism 16 and the slit valve door 14 being shown diagrammatically at 17.

A not-illustrated buffer chamber is provided externally of the housing 11, with the slit valve door 14 controlling access to one end of the buffer chamber, and with a similar door providing access to the opposite end of the buffer chamber. The buffer chamber effectively serves as an air lock for wafers being inserted into and removed from the process chamber 12 through the slit 13, in order to keep particles out of the chamber, and in order to maintain production conditions within the chamber, such as a vacuum. For clarity, the buffer chamber has been omitted from FIG. 1.

A cylindrical wafer support 18 is provided centrally within the housing 11, and is supported on the floor of the housing by several vertical legs 19. The wafer support 18 has on its upper side a ridge which can support a flat, circular silicon wafer 21. The wafer 21 can be introduced into and removed from the housing 11 through the slit 13 by a wafer transport mechanism 22, as indicated diagrammatically at 23.

An inlet conduit 27 extends vertically through the center of the top wall of the housing 11, and a cylindrical nozzle 26 is provided at the lower end of the conduit 27 in communication therewith, the nozzle 26 having an upper side which is spaced a small distance below the top wall of the housing 11. The nozzle 26 has a plurality of openings 28 in the underside thereof, through which streams of gas can be directed downwardly toward the wafer 21, as indicated diagrammatically at 31. Depending on the particular process or processes which are being carried out in the chamber 12, an electrical potential may optionally be applied to the nozzle 26 by a not-illustrated apparatus, in order to cause the nozzle 26 to function as an electrode. The nozzle 26 in FIG. 1 is a type sometimes referred to in the art as a showerhead, which is depicted by way of example. The invention encompasses the use of other types of production nozzles.

An exhaust conduit 32 opens into the housing 12 at the center of the bottom wall thereof. An inlet conduit 33 opens into the housing 11 through a side wall thereof.

An upper cleaning nozzle 36 is a circular tube, which is disposed within the chamber 12 and extends around an upper outer corner of the chamber interior. An inlet conduit 37 extends through the housing 11 in order to supply a gas to the nozzle 36 from externally of the housing 11, in a manner described in more detail later. The nozzle 36 has a plurality of not-illustrated openings which can direct gas flow in various directions, as indicated diagrammatically broken lines 38.

A lower cleaning nozzle 41 is also a circular tube, which is disposed within the chamber 12 and extends along the periphery of the underside of the wafer support 18. An inlet conduct 42 extends through the housing 11 to supply gas to the nozzle 41 from externally of the housing 11. The nozzle 41 has a plurality of not-illustrated openings, which can direct gas flow in various directions, as indicated diagrammatically by broken lines at 43.

The chamber 12 includes on the outer side 11 a chamber heater 46, in the form of a heating blanket. In FIG. 1, the chamber heater 46 is shown diagrammatically as being on the sidewall of the housing 11, but it will be recognized that the chamber heater 46 could also have portions on the outer sides of the top and bottom walls of the housing 11. The process chamber 12 may also include within the housing 11 an arrangement of conventional and not-illustrated radio frequency (RF) coils, for the purpose of introducing RF energy into the chamber 12 to excite gases therein in order to strike a plasma.

The exhaust conduct 32 extends successively in FIG. 1 to a throttle valve 51, an isolation valve 52, an in-situ particle monitor (ISPM) 53 and a vacuum pump 56. The order of these components in the exhaust conduit may be different.

The throttle valve 51 is a variable valve, the degree of opening of which can be adjusted through a range of positions from fully opened to fully closed. The isolation valve 52 is an on/off type valve, which is either fully open or fully closed. The valve 52 would normally be kept open at all times during a production mode of operation.

The ISPM 53 is a conventional and commercially available device, which evaluates the number and size of particles passing through the exhaust conduit 32. In the disclosed embodiment, the ISPM 53 has a not-illustrated laser beam, which is interrupted by some of the particles passing through the exhaust conduit 32. The size of a particle can be determined by characteristics of the interruption of the laser beam, and the number of particles can be determined by the number of interruptions which occur during a selected time interval. The disclosed ISPM 53 categorizes the detected particles by size, in particular into four groups or bins which each correspond to a respective, mutually exclusive size range. Although the ISPM 53 of the disclosed embodiment uses four bins, it will be recognized that the invention encompasses use of a larger or smaller number of bins.

The vacuum pump 56 is capable of pumping down the pressure within the process chamber 12 through the exhaust conduit 32, so that the pressure within the process chamber 12 is substantially below atmospheric pressure. The vacuum pump 56 can be turned on and off, but is normally on during the production mode of operation of the process chamber 12.

A system controller is shown diagrammatically at 57, and includes a digital processor 58. Although the system controller 57 is depicted diagrammatically in FIG. 1 as a single unit, it will be recognized that the system controller 57 may actually be implemented in the form of several separate controller units which communicate with each other and which carry respective portions of the processing load. For convenience, however, the system controller 57 is shown as a single unit in FIG. 1.

The system controller 57 generates a plurality of valve control signals, which are designated collectively with the reference numeral 61. The valve control signals 61 control the throttle valve 51 and the isolation valve 52, as well as several other valves in FIG. 1 which are discussed below. The outputs 62 of the ISPM 53 are coupled to inputs of the system controller 57. The system controller 57 outputs a pump control signal 63, which specifies whether the vacuum pump 56 is to be on or off. The system controller 57 also outputs slit valve control signals at 67, which are supplied to and control the slit valve control mechanism 16.

The system controller 57 also outputs a heater control signal 68, which is coupled to the chamber heater 46, and which can be varied in a manner that varies the temperature maintained within the process chamber 12. It will be recognized that a not-illustrated temperature sensor could also be provided within the chamber 12, and could be coupled to an input of the system controller 57.

The system controller 57 outputs several groups of mass flow control signals, which are designated collectively at 69. The mass flow control signals are coupled to devices that are discussed in more detail later.

A host computer 72 is coupled to the system controller 57 by a communication link 73. The host computer 72 may simultaneously control several systems that are all similar to the system 10 depicted in FIG. 1. The host computer 72 generates wafer transport control signals at 74, which are coupled to and control the wafer transport mechanism 22. It would alternatively be possible for the system controller 57 to generate the wafer transport control signals, based on instructions received from the host computer 72. However, the host computer 72 ultimately controls the movement of wafers between the system 10 of FIG. 1 and other not-illustrated systems, and FIG. 1 thus indicates that the host computer 72 generates the wafer transport control signals, because it is the host computer 72 which must coordinate the transport of wafers between various systems.

A gas source GAS1 communicates with a mass flow controller (MFC) 81 through an on/off inlet valve 82. The MFC 81 communicates through an on/off outlet valve 83 with a manifold 96. The MFC 81 receives a respective group of the mass flow control signals generated at 91 by the system controller 57, and implements a gas flow rate which is specified by these control signals. The inlet and outlet valves 82 and 83 are each controlled by respective valve control signals generated at 61 by the system controller 57.

A further gas source GAS2 communicates through an on/off inlet valve 87 with a MFC 86, the MFC 86 communicating with the manifold 96 through an on/off outlet valve 88. Similarly, another gas source GAS3 communicates with a MFC 91 through an on/off inlet valve 92, the MFC 91 communicating with the manifold 96 through an on/off outlet valve 93. The MFCs 86 and 91 are each controlled by a respective group of the mass flow control signals generated at 69 by the system controller 57, and the valves 87–88 and 92–93 are each controlled by a respective valve control signal generated at 61 by the system controller 57. The manifold 96 has an outlet which communicates with the inlet conduit 27. Although FIG. 1 shows three gas sources GAS1, GAS2 and GAS3, which each communicate with the manifold 96 through a respective mass flow controller and valve arrangement, it will be recognized that a larger or smaller number of gas sources could be provided, where each communicates with the manifold through a respective mass flow controller and valve arrangement.

The gas source GAS1 also communicates with a MFC 101 through an on/off inlet valve 102, the MFC 101 communicating with the inlet conduit 37 for the cleaning nozzle 36 through an on/off outlet valve 103. Similarly, the gas source GAS1 communicates with an MFC 106 through an on/off inlet valve 107, the MFC 106 communicating with the inlet conduit 42 for the nozzle 41 through an on/off outlet valve 108. The MFCs 101 and 106 are each controlled by a respective group of the mass flow control signals generated at 69 by the system controller 57. The valves 102–103 and 107–108 are each controlled by a respective valve control signal generated at 61 by the system controller 57.

A nitrogen gas source $N_2$ is coupled through a valve 111 to the conduit 33. The valve 111 is an on/off valve, which is controlled by one of the valve control signals generated at 61 by the system controller 57. When the chamber 12 is under a vacuum and is to be brought up to atmospheric pressure, the vacuum pump 56 will be turned off, the isolation valve 52 will be closed, and then the valve 111 will be opened to introduce nitrogen gas into the chamber 12 until the pressure level equals atmospheric pressure. Nitrogen gas is used because it is inert and will not react with process gases that may be present in the chamber as a result of the most recent process conducted in the chamber. During the production mode of operation of the chamber 12, the valve 111 will normally be kept closed.

It will be recognized that a not-illustrated regulator valve could optionally be provided in series with the valve 111 for the nitrogen gas. As a further alternative, it will be recognized that the inlet conduit 33, the valve 111, and the gas source $N_2$ could be eliminated, and the chamber could be brought to atmospheric pressure by supplying the nitrogen gas through one of the illustrated nozzles, such as the production nozzle 26.

When the system 10 of FIG. 1 is in a production mode of operation, it will process silicon wafers 21 during successive production intervals, which are spaced from each other in time by nonproduction intervals which are part of the production mode of operation. During a production interval, the system 10 will typically process several wafers 21 in sequence. During non-production intervals, the process chamber 12 is not processing wafers but is maintained in a production-ready state. For example, the process chamber 12 is maintained at a low pressure by the vacuum pump 56, so that the next production interval can commence without the relatively significant delay required to pump the chamber 12 down from atmospheric pressure to the low pressure needed for production.

During a production interval, the nitrogen valve 111 will be closed, and the outlet valves 103 and 108 will be closed in order to prevent any flow of gas to the cleaning nozzles 36 and 41. One or more of the gas sources GAS1, GAS2 and GAS3 will supply gas through the manifold 96 and the nozzle 26 to the process chamber 12, in order to carry out a specific process step on the particular wafer 21 disposed within the chamber 12, such as an etching step. Depending on the particular process step, the chamber may be heated by the chamber heater 46, the nozzle 26 may be electrically stimulated so that it acts as an electrode, and/or RF energy may be emitted within the chamber 12 so that gases therein strike a plasma.

As production gases flow out of the chamber 12 through the exhaust conduit 32, the ISPM 53 is used to monitor the size and count of particles carried with the gases. The system controller 57 receives this information at 62, and compares it to a predetermined ISPM signature, which is specific to the particular process that is currently being carried out. As discussed above, the ISPM 53 in the disclosed embodiment provides a particle count for each of four bins or size ranges, and a particular ISPM signature in the system controller 57 includes a predetermined particle count for each of the four bins. The measured particle count for each bin is compared with the predetermined particle count specified for that bin by the ISPM signature. If the actual particle count for any given bin exceeds the predetermined particle count which is specified for that bin by the signature, than the actual ISPM reading is flagged as abnormal so that appropriate action can be taken, as described below.

Figure 2A:
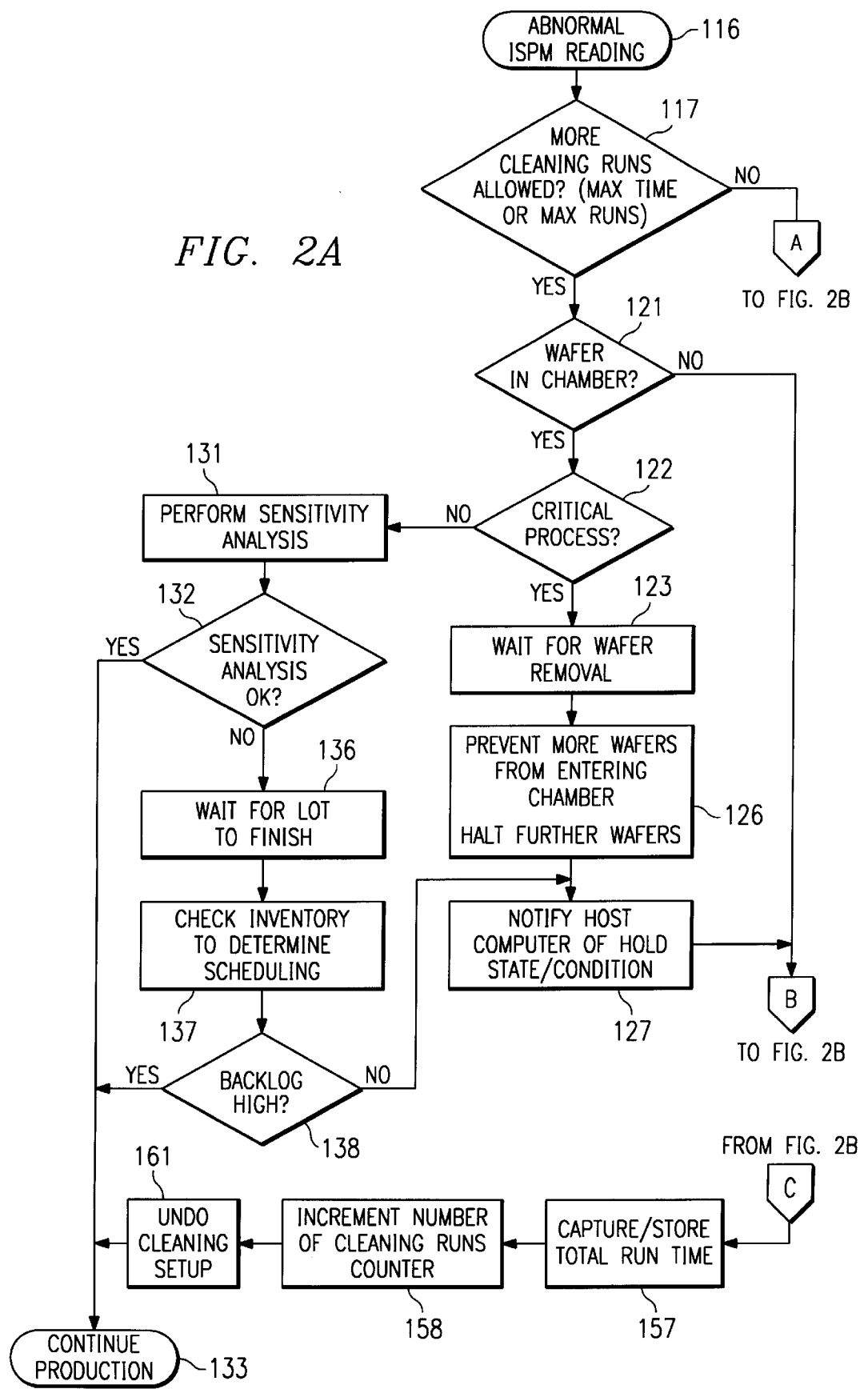
FIGS. 2a and 2b are a flowchart of part of a program executed by a processor which is a component of the system of FIG. 1.
Figure 2B:
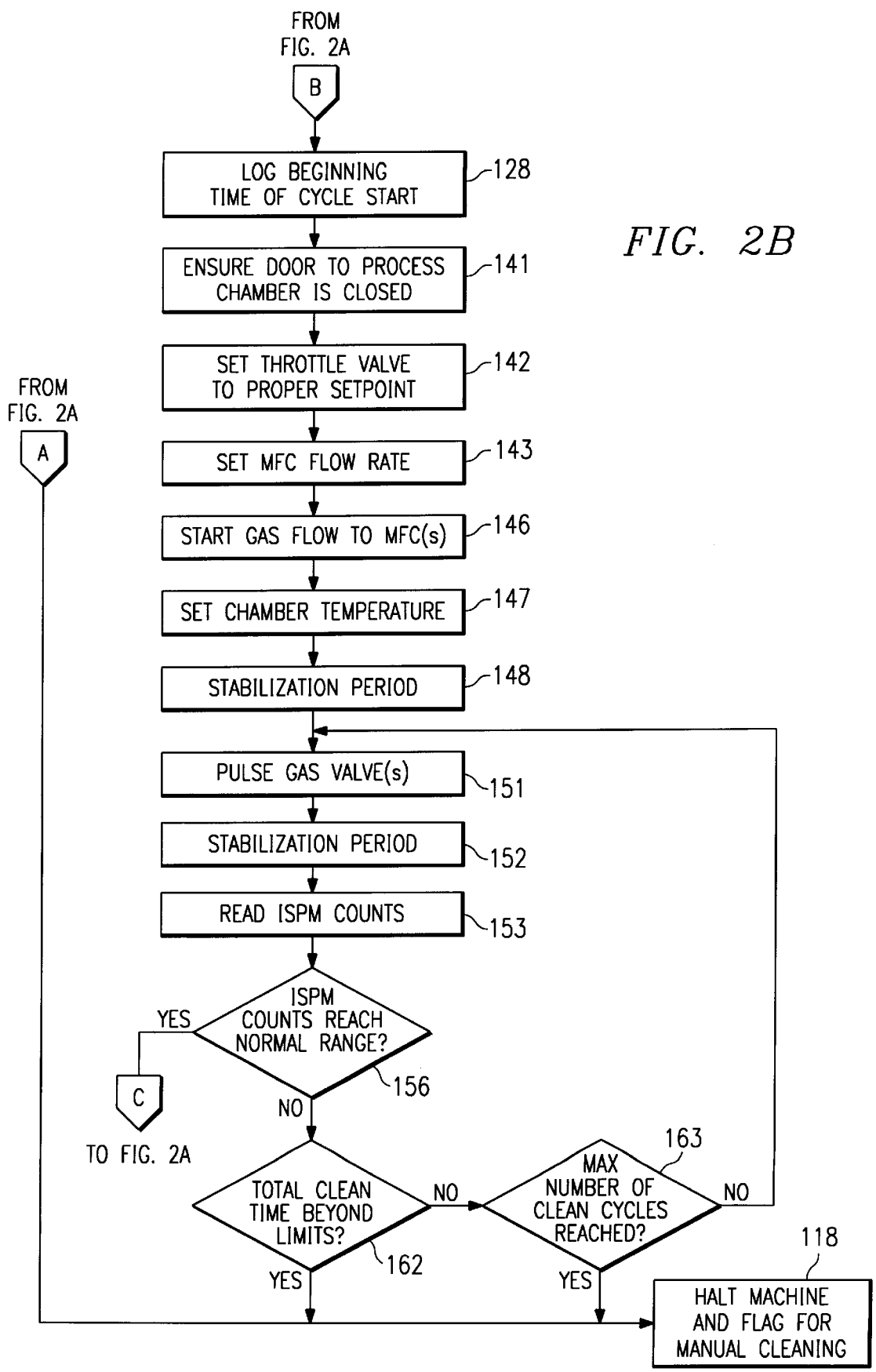

More specifically, FIGS. 2a and 2b are a flowchart representing a portion of a program executed by the processor 58 of the system controller 57. If the system 10 of FIG. 1 detects an abnormal ISPM reading during a production interval while operating in the production mode, the processor 58 enters the routine of FIG. 2a at block 116. Control then proceeds from block 116 to block 117. At block 117, the processor 58 checks to see whether the cumulative number of interim cleaning procedures carried out since the last manual wet clean has reached a predetermined maximum number. If it has, then control proceeds directly to block 118, where the system 10 is shut down so that a manual wet clean procedure can be carried out. In block 117, the processor 58 also checks to see whether the cumulative time spent in interim cleaning procedures since the last wet clean is in excess of a predetermined time. If so, then control proceeds directly from block 117 to block 118, where the system is shut down to facilitate a wet clean.

On the other hand, if it is determined at block 117 that further interim cleaning procedures are permissible, then control proceeds from block 117 to block 121, where the processor 58 checks to see if a wafer 21 is currently in the chamber 12. If so, then control proceeds from block 121 to block 122, where the processor 58 makes a determination of whether the current process is a critical process. A process is critical if product loss would result from processing further wafers under the abnormal conditions detected by the ISPM 53, or if the system 10 is the only system which is performing a particular process step.

If the process is determined to be critical at block 122, then the processor 58 proceeds to block 123, where it waits until the current wafer 21 has been removed from the chamber 12 by the wafer transport mechanism 22. The processor 58 then proceeds to block 126, where it cooperates with the host computer 72 to prevent the wafer transport mechanism 22 from inserting the next wafer 21 into the chamber 12, then proceeds to block 127, where it notifies the host computer 72 that the system 10 is in a hold state, and then proceeds to block 128. Block 128 represents the start of an interim cleaning procedure, which is described in more detail below. If it had been determined at block 121 that there was no wafer 21 in the chamber 12, then the processor 58 would have proceeded directly from block 121 to block 128, in order to start an interim cleaning procedure.

Referring again to block 122, if it is determined that the process being carried out in the chamber 12 is not a critical process, then control proceeds from block 122 to block 131, where the processor 58 performs a sensitivity analysis. In general terms, the processor 58 evaluates whether the abnormal particle reading from the ISPM 53 is sufficiently abnormal to require further interim cleaning, or is not yet sufficiently abnormal to preclude further wafering processing before an interim cleaning procedure is carried out. As a more specific example, the abnormality which brought the processor 58 to the block 116 may reflect a determination that the particle count for one bin has exceeded a predetermined particle count associated with that bin. The sensitivity analysis at block 131, which is specific to the particular process being carried out in the chamber, could involve an evaluation of the extent to which the actual particle count is in excess of the predetermined particle count for the particular bin, and/or an evaluation whether the actual particle count is abnormal for one bin, two bins, three bins or all four bins.

If the sensitivity analysis results in a determination that further production is permissible before performing an interim cleaning procedure, then at block 132 control proceeds to block 133, and processing of wafers continues. On the other hand, if the sensitivity analysis results in a determination that only a nominal amount of additional production should be carried out before an interim cleaning procedure is performed, then control proceeds from block 132 to block 136, where the processor waits while the system 10 finishes the current lot of wafers 21 which it is processing. Then, at block 137, the processor 58 checks with the host computer 72 to determine whether the backlog of wafers waiting for processing is high. If it is, then at 138 the processor proceeds to block 133, where the system continues processing wafers. Otherwise, the processor continues from block 138 to block 127, where it notifies the host computer 72 that the system 10 is entering a hold state, and then proceeds to block 128.

As mentioned above, block 128 is the start of an interim cleaning procedure, which may also be referred to as a cleaning run. At block 128, the processor 58 records the time at which the interim cleaning procedure begins. This is done so that the time which elapses during this interim cleaning procedure can be determined, and then added to the cumulative time for all interim cleaning procedures carried out since the last wet clean procedure. Then, at block 141, the processor 58 generates appropriate signals at 67 to ensure that the slit valve control mechanism 16 has the slit valve door 14 in its closed position. Then, that block 142, the processor 58 uses one of the signals 61 to set the throttle valve 51 to an appropriate degree of opening, which in the disclosed embodiment is selected to facilitate a chamber pressure of approximately 10 mT. Then, at block 143, the processor 58 uses the mass flow control signals at 69 to set appropriate flow rates for the MFCs 81, 101 and 106. In the disclosed embodiment, these MFCs are each set to a flow rate of approximately 1000 SCCM. In the embodiment shown in FIG. 1, these three MFCs are all associated with the gas source GAS1. The gas source GAS1 supplies an inert gas such as nitrogen or argon, which will not react with process gases that may be present in the chamber 12 before the interim cleaning procedure begins, or that may be introduced into the chamber 12 after the interim cleaning procedure is completed. In the disclosed embodiment, the gas from source GAS1 is used as both a production gas and a cleaning gas. However, it will be recognized that the gas from the gas source GAS1 could be used just for cleaning.

At block 146, the processor 58 generates signals at 61 which will open the inlet valves 82, 102 and 107 for the respective MFCs 81, 101 and 106. Then, at block 147, the processor 58 uses the signal 68 to set the chamber heater 46 so as to implement a predetermined chamber temperature, which in the disclosed embodiment is approximately 100° F. Then, at 148, the processor 58 waits for a predetermined time interval, which in the disclosed embodiment is approximately 10 seconds. This time interval serves as a stabilization period, in order to allow the flow rate in the MFCs 81, 101 and 106 to stabilize, and in order to allow the chamber heater 46 to bring the chamber 12 to the desired temperature.

Then, at 151, the processor 58 simultaneously opens the outlet valves 83, 103 and 108, and then simultaneously closes them after a brief time interval. This may be repeated several times. In the disclosed embodiment, the number of times these valves are simultaneously opened and then closed at block 151 may range from one time to thirty times. The time interval between turning these valves on and turning them off is approximately 0.5 second in the disclosed embodiment, and the time between turning these valves off and turning them back on is also 0.5 second. This creates a pulsing or modulation of the flow rate of the cleaning gas into the chamber 12 through the conduits 27, 37 and 42 and the nozzles 26, 36 and 41, which in turn creates turbulence within the chamber 12. The turbulence acts to help dislodge particles from the chamber walls and other structure, so that the particles flow out through the exhaust conduit 32 with the cleaning gases. Because the vacuum pump 56 is maintaining the chamber 12 at a low pressure which is comparable to the low pressure used for production, gas velocities will be higher than at atmospheric pressure, which in turn effects more efficient cleaning. At the end of the last pulse, the processor 58 will close the inlet valves 82, 102 and 107 and then close the outlet valves 83, 103 and 108.

Then, at block 152, the processor 50 delays for another time interval which serves as a further stabilization period. In the disclosed embodiment, this stabilization period is approximately 5 seconds. This stabilization period allows the turbulence and other effects of the pulsing or modulation to subside. Then, at block 153, the processor 58 reads from the ISPM 53 particle information which the ISPM has just gathered, and then at block 156 evaluates whether the actual particle counts just obtained from the ISPM are within a normal range. If so, the interim cleaning procedure was successful and can be ended. In particular, the processor 58 proceeds from block 156 to block 157, where it records the ending time of the interim cleaning procedure, so that the actual duration of the interim cleaning procedure can be determined from a difference between this time and the time recorded at block 128. Then, at block 158, the processor 58 increments an internal count of the number of interim cleaning procedures it has carried out since the last wet clean procedure.

At block 161, the processor 58 restores certain settings which were changed to facilitate the interim cleaning procedure. For example, where the flow control setting of the MFC 81 was changed from a production setting to an interim cleaning setting, the processor 58 may restore the production setting of the MFC 81 at the block 161. From block 161, the processor 58 proceeds to block 133, in order to resume production processing of wafers.

Referring again to block 156, if it were determined at block 156 that the actual particle counts provided by the ISPM 53 after interim cleaning were still too high, the processor 58 would proceed to block 162. At block 162, the processor 58 would determine the cumulative amount of time spent in this and other interim cleaning procedures since the last wet clean procedure, and then evaluate whether this cumulative time was greater than a predetermined maximum. This is similar to the determination which was made at block 117, as described above. If the predetermined time has been exceeded, then the processor proceeds directly from block 162 to block 118, where it shuts down the system 10 so that a wet clean procedure can be performed.

On the other hand, if it is determined at block 162 that the cumulative interim cleaning time is less than the predetermined maximum, then the processor proceeds to block 163, where it evaluates whether the total number of interim cleaning procedures which have been performed since the last wet clean procedure, including this interim cleaning procedure, exceed a predetermined maximum number. If so, then control proceeds directly from block 163 to block 118, where the system 10 is shut down so that a manual wet clean procedure can be performed. Otherwise, control proceeds from block 163 back to block 151, in order to carry out another interim cleaning cycle in which gas is supplied to the chamber 12 and the gas flow is pulsed or modulated.

Between blocks 156 and 162 of FIG. 2b, it is optionally possible to introduce one or more seasoning wafers into the chamber 12, then introduce a combination of gases and strike an appropriate plasma, and then remove the seasoning wafers. In response to such a plasma, the seasoning wafers leave in the chamber a film which tends to trap contaminate particles. After removing the seasoning wafers, a further particle reading could be taken by the ISPM, and compared to acceptable particle counts. If the actual counts had decreased to an acceptable level, then control would proceed to block 157. Otherwise, control would proceed to block 162.

The present invention provides numerous technical advantages. Once such technical advantage is that an interim cleaning procedure can be carried out without putting the process chamber in a nonproduction mode, thereby permitting production to be resumed more rapidly than when a process chamber must be shifted from a nonproduction mode to a production mode. Thus, the time required to bring the particle counts in the process chamber to an acceptable level is reduced. For similar reasons, there is an increase in the availability of the process chamber to produce marketable product. A further advantage is that pulsing or modulation of the gas flow creates turbulence which enhances the cleaning effect. Yet another advantage is that the process chamber will be suitably clean for every wafer processed, as opposed to a situation where measurements are made only infrequently and/or through indirect techniques such as the use and testing of particle wafers. Still another advantage is that cleaning is effectively carried out during nonproduction intervals of time which are present between production intervals, thereby permitting cleaning in a manner which minimizes disruption of scheduled production.

Although one embodiment has been illustrated and described in detail, it should be understood that various changes, substitutions and alterations can be made therein without departing from the scope of the present invention. For example, pulsing or modulation of the flow of cleaning gases is effected in the disclosed embodiment by modulating outlet valves. However, pulsing could be effected by modulating inlet valves, or by modulating the setting of the throttle valve. As another example, the disclosed embodiment simultaneously pulses the various gas flows to all of the nozzles used for cleaning. However, the pulsing could be effected by initiating a gas flow through each of several nozzles used for cleaning, and then successively pulsing the respective gas flows to the respective nozzles in a cyclic sequence.

As yet another example, respective separate mass flow controllers are provided for the gas flows to each of the three nozzles used for cleaning. However, it would be possible to use the same mass flow controller for all three nozzles, by coupling the outlet of the manifold through an on/off isolation valve to each of the inlet conduits for the two cleaning nozzles. It would also be possible to completely eliminate the mass flow controllers while still using valves to effect pulsing or modulation of the flow of cleaning gas. As still another example, the nozzles in the disclosed embodiment are stationary. However, the nozzles could be supported for movement during the pulsing or modulation of the flow of cleaning gas. Another example is that the disclosed embodiment involves a chamber adapted for use in processing substrates for semiconductor devices. However, the invention can be used with other types of chambers, such as those which process substrates like magnetic disks or compact disks.

Yet another example is that the disclosed embodiment uses a single cleaning gas such nitrogen or argon, but it would be possible to use a combination of gases for cleaning, and to pulse or modulate the flow of these combined gases. As yet another example, the disclosed embodiment uses a vacuum pump to maintain a vacuum in the process chamber while the flow of cleaning gases is pulsed or modulated. However, the cleaning gases in the process chamber could have a higher pressure, such as atmospheric pressure, while they are pulsed or modulated.

It should also be recognized that direct connections disclosed herein could be altered, such that two disclosed components or elements are coupled to one another through an intermediate device or devices without being directly connected, while still realizing the present invention. Other changes, substitutions and alterations are also possible without departing from the spirit and scope of the present invention, as defined by the following claims.

What is claimed is:

1. A method of cleaning a process chamber, comprising the steps of:

providing a chamber having a nozzle in the chamber and an exhaust from said chamber;

providing a production mode in said chamber in which substrate production is effected during successive production intervals that are spaced in time from each other by nonproduction intervals in which substrate production is not effected;

providing a count of particles in said exhaust; and causing a gas supply mechanism to effect cleaning of the chamber by supplying gas through the nozzle to the chamber during said nonproduction interval while pulsing a flow of the gas responsive to an abnormal count of said particles exiting said chamber.

2. A method according to claim 1, further including the step of maintaining a vacuum in the chamber during the production mode, including the production and nonproduction intervals.

3. A method according to claim 1, wherein said pulsing of the flow of the gas is carried out by modulating a degree of opening of a valve which controls a flow of gases exiting the chamber.

4. A method according to claim 1, wherein said pulsing of the flow of the gas is carried out by modulating a valve of the gas supply mechanism.

5. A method according to claim 4, further including the step of setting a flow rate for the flow of gas from the gas supply mechanism by providing a mass flow controller for said gas.

6. A method according to claim 1, further including the step of evaluating a level of particles carried by gases exiting the chamber during production intervals to determine when to perform a cleaning step.

7. A method according to claim 1, further including the step of evaluating the level of particles carried by gases exiting the chamber during a cleaning step in order to determine when to terminate the cleaning step.

* * * * *